July 1, 1958 I. G. A. CRESSELL 2,840,885

SEMI-CONDUCTING AMPLIFIERS

Filed Jan. 26, 1955

Inventor:
Ian George Archie Cressell
By his attorneys:
Baldwin + Wight 2,840,885

SEMI-CONDUCTING AMPLIFIERS

Ian George Archie Cressell, Black Notley, England, assignor to Marconi's Wireless Telegraph Company Limited, London, England, a British company Application January 26, 1955, Serial No. 484,276

Claims priority, application Great Britain January 28, 1954

1 Claim. (Cl. 29—25.3)

This invention relates to semi-conducting amplifiers, i. e. the so-called P–N–P and N–P–N transistors.

The object of the invention is to provide improved semi-conducting amplifiers which shall be efficient, stable in operation and, compared to known transistors, relatively easy to make with precision and in accordance with predetermined design requirements.

The grown type of junction offers important advantages in a transistor, notably the advantage of low noise effects and high turnover voltage. On the other hand known semi-conducting amplifiers employing this type of junction are difficult to make with precision and to a predetermined design mainly because of mechanical and manufacturing difficulties in making connection to the grown junction. The present invention seeks to obtain the advantages inherent in the use of grown junctions without the manufacturing disadvantages.

According to this invention there is provided a method of making a semi-conducting amplifier including the steps of forming a specimen with a grown junction between P and N materials, electrolytically etching said specimen to produce, by differential etching, a visible step therein, where the junction is situated, and providing at least one alloy junction to serve as an emitter junction on at least one side of the grown junction at a predetermined distance therefrom.

Preferably the alloy junction is located at the base of a recess or well with said base at a predetermined distance from the grown junction, the alloy junction being formed by placing a pellet of the desired alloy material at the bottom of the well or recess and heating. This location of the alloy or emitter junction has the advantage that it enables soldered connections to be made to the alloy junction without much difficulty, for the alloy junction is physically separate from the points of solder connection by being at the bottom of the well or recess, and, therefore, no very great precautions have to be taken to prevent the soldering operation spoiling the alloy junction.

The grown junction may be made in any manner well known per se. Thus it may be made by the so-called "pulling" process in which a seed crystal is drawn out while at an elevated temperature. It may also be made by what may be termed the horizontal zone melt process in which a seed crystal of one type (N type) is placed in contact with an ingot of the other type (P type), heat is applied to merge the two in well known manner, and the heating zone then moved slowly along the length of the ingot. Both these processes are known per se and form per se no part of this invention.

For a better understanding of the invention and to show how the same may be carried into effect reference will now be made to the accompanying drawing which shows schematically, different stages in the method. The drawing and description relate to a method of making an N–P–N transistor with an alloy emitter junction using antimony. As will be clear later, however, the invention may be similarly employed to form a P–N–P transistor with an alloy emitter using, for example, indium.

Figure 1:
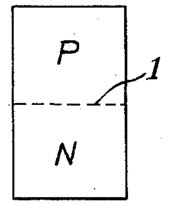
Fig. 1 illustrates the assembly of the P and N material used in the method of my invention.
Figure 2:
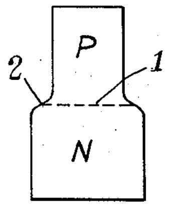
Fig. 2 illustrates the method of removing the P material from a stepped portion of the N material.

Referring to the drawing, the first step in the process consists in producing a grown junction in a bar specimen in any known way, as by the "pulling" method or the horizontal zone melt method, between P and N materials. In Fig. 1, the junction is a plane junction indicated by the broken line 1, the P material is indicated by the reference P and the N material by the reference N. The dimensions of the specimen are, of course, variable as desired but, as an example, it may be about 4 millimetres long and square in section on a side of 2 millimetres. As will be obvious it is extremely difficult to locate precisely where the grown junction is in a specimen as shown in Fig. 1 and this fact has led hitherto to great difficulties in reproducing transistors closely to a predetermined design. In carrying out this invention, however, the specimen (Fig. 1) is subjected to electrolytic etching. The bath may be for example KOH or $H_2O_2$ and a current density of about 1 milliampere per square centimetre may be used, the current being passed through the specimen by connectors (not shown) temporarily attached to the P and N materials. Electrolytic etching causes removal of the material from the P and N portions of the specimen at substantially different rates and, accordingly, a visible step is produced substantially in the plane of the junction. This is shown in Fig. 2 where the step (much exaggerated) is indicated at 2.

Figure 3:
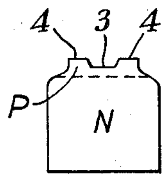
Fig. 3 illustrates the manner of forming the recess or well in the step formed in the P material.

The P material is now removed above (i. e. on the side remote from the N material) a plane at a predetermined distance, for example about 20 thousandths of an inch, from the junction and a recess or well is formed in the remaining P material as indicated at 3 in Fig. 3. This recess or well may most conveniently be formed by what is termed ultrasonic drilling, that is to say drilling by means of an electrically vibrated member driven for example magnetostrictively at ultrasonic frequency and working with suitable abrasive. Ultrasonic drilling is, of course, well known per se. The drilling is continued until the base of the well 3 is at a desired predetermined distance from the plane of the junction 1, for example within 2 thousandths of an inch therefrom. The flat face round the well is then ground to a good smooth finish, this face being indicated at 4. The bottom and walls of the well are then cleaned by etching with a suitable material, for example a mixture of hydrofluoric and nitric acids.

Figure 4:
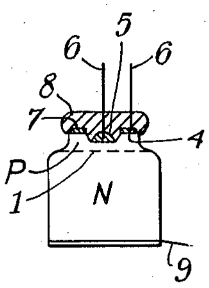
Fig. 4 illustrates the manner of assembling the emitter junction with the P material.

A pellet 5 of antimony (Fig. 4) is now placed in the well and heated to about 550° C. for about ten minutes to alloy with the P material and form the alloy or emitter junction. Connectors to this junction are provided in the form of gold wires 6, one being soldered to the antimony and other to a flat connector 7 on the ground face 4 and encircling the well. This gives a good and relatively low resistance connection to the emitter junction base. It will be observed that since the alloy is at the bottom of the well there is sufficient physical separation from the base connector to ensure that soldering it in position will not spoil the alloy junction.

The emitter is again etched with hydrofluoric and nitric acid mixture to clean it and then washed, for example with a sequence of $H_2O$, $C_2H_5OH$ and $CCl_4$.

The emitter junction and its connectors are now enclosed with a suitable protecting substance at 8, for example a silicone resin. A final electrolytic etch is applied to the collector or grown junction 1 (this is a repetition of the electrolytic etch step already described and is performed to ensure that the various subsequent manufacturing stages shall not leave this junction partly spoilt) and a collector connector 9 is soldered on. After final washing the whole device is impregnated in a suitable protecting material such for example as a silicone resin with a curing temperature lower than that of the material used at 8.

It will be seen that with this manufacturing process the position of the grown junction can be precisely determined because it is rendered visible and the alloy junction can be located with great precision relative to the grown junction. The whole transistor can be made without serious manufacturing difficulties and is reproducable closely to a predetermined design. The invention thus provides a transistor, the characteristic of which is the combination of a grown junction in predetermined relation with an alloy junction, the grown junction being rendered visible by electrolytic, and therefore differential, etching of the materials on either side thereto.

Although in the illustrated and described embodiment there are only two junctions and the connector 9 is the usual collector connector, it is possible to provide a second alloy junction on the other side of the grown junction 1 and similar to that already described. In other words, it is possible to provide below the grown junction 1 of Fig. 4 an arrangement exactly like that shown above it and in mirror image relationship thereto. If this is done what is in fact a double or cascade transistor device is obtained.

Figure 5:
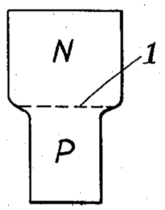
Fig. 5 illustrates a modified method according to my invention.
Figure 6:
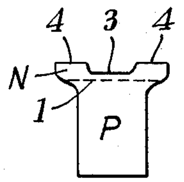
Fig. 6 illustrates the method of forming a step in the N material.
Figure 7:
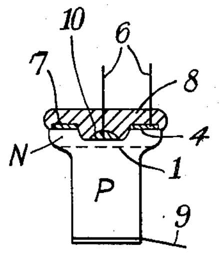
Fig. 7 illustrates the method of applying the junction and the protecting substance over the N material for completing the method illustrated in Figs. 5 and 6.

As already stated the invention is applicable to P–N–P transistors as well as to N–P–N transistors. The method of manufacturing in this case is virtually the same as above described though of course the antimony for the alloy or emitter junction is replaced by appropriate other material, preferably indium. Figs. 5, 6 and 7 illustrate, in the same manner as the preceding figures, the application of the invention to a P–N–P transistor, the same references being used for the same parts throughout. From Fig. 4 it will be noted that the electrolytic etching which removes the P material faster than the N material, produces a step which is reversed as compared with Fig. 2. In Fig. 7 the reference 10 indicates the indium of the alloy junction.

While I have described my invention in certain of its preferred embodiments, I realize that modifications may be made, and I wish it to be understood that no limitations upon my invention are intended other than may be imposed by the scope of the appended claims.

I claim:

A method of making a semi-conducting amplifier including the steps of forming a specimen with a grown junction between P and N materials, electrolytically etching said specimen to produce, by differential etching, a visible step therein where the junction is situated, forming at least one well by ultrasonic drilling, the drilling being continued until the base is at a desired predetermined distance from the grown junction, providing an alloy junction at the base of said well to serve as an emitter junction on at least one side of the grown junction, the alloy junction being formed by placing a pellet of the desired alloy material at the bottom of the well and then heating same so as to cause the alloy material to alloy with the material of which the well is formed.

References Cited in the file of this patent

UNITED STATES PATENTS

| | | |
|---|---|---|
| 2,656,496 | Sparks | Oct. 20, 1953 |
| 2,689,930 | Hall | Sept. 21, 1954 |
| 2,713,132 | Matthews et al. | July 12, 1955 |
| 2,725,505 | Webster et al. | Nov. 29, 1955 |